United States Patent
Lemmi et al.

(10) Patent No.: US 6,794,725 B2
(45) Date of Patent: Sep. 21, 2004

(54) AMORPHOUS SILICON SENSOR WITH MICRO-SPRING INTERCONNECTS FOR ACHIEVING HIGH UNIFORMITY IN INTEGRATED LIGHT-EMITTING SOURCES

(75) Inventors: Francesco Lemmi, Menlo Park, CA (US); Christopher L. Chua, San Jose, CA (US); Ping Mei, Palo Alto, CA (US); JengPing Lu, Mountain View, CA (US); David K. Fork, Los Altos, CA (US); Harry J. McIntyre, Oceanside, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/469,122

(22) Filed: Dec. 21, 1999

(65) Prior Publication Data

US 2003/0057533 A1 Mar. 27, 2003

(51) Int. Cl.⁷ .............................................. H01L 31/00
(52) U.S. Cl. ........................ 257/448; 257/414; 257/415; 257/457; 257/459; 257/81; 257/99
(58) Field of Search ................................ 257/414, 415, 257/678, 696, 688–690, 80–88, 91, 99, 100, 290, 431, 433, 448, 457, 459, 700

(56) References Cited

U.S. PATENT DOCUMENTS

| | | | | |
|---|---|---|---|---|
| 4,812,415 A | * | 3/1989 | Yamazaki et al. | 438/80 |
| 5,142,381 A | * | 8/1992 | Kitamura et al. | 358/482 |
| 5,475,211 A | * | 12/1995 | Ogura et al. | 250/208.1 |
| 5,528,272 A | | 6/1996 | Quinn et al. | 347/42 |
| 5,568,320 A | | 10/1996 | Rees et al. | 359/652 |
| 5,613,861 A | | 3/1997 | Smith et al. | 439/81 |
| 5,841,565 A | * | 11/1998 | Kanai | 398/202 |
| 5,843,802 A | | 12/1998 | Beernink et al. | 438/45 |
| 5,848,685 A | | 12/1998 | Smith et al. | 206/275 |
| 5,859,658 A | * | 1/1999 | Hammond | 347/238 |

(List continued on next page.)

FOREIGN PATENT DOCUMENTS

JP          03085466 A    *    4/1991

Primary Examiner—Bradley Baumeister
Assistant Examiner—Chris C. Chu
(74) Attorney, Agent, or Firm—Fay, Sharpe, Fagan, Minnich & McKee, LLP

(57) ABSTRACT

A hybrid structure or device is provided wherein carried on a single substrate is at least one micro-spring interconnect having an elastic material that is initially fixed to a surface of the substrate, an anchor portion which is fixed to the substrate surface and a free portion. The spring contact is self-assembling in that as the free portion is released it moves out of the plane of the substrate. Also integrated on the substrate is a sensor having an active layer and contacts. The substrate and sensor may be formed of materials which are somewhat partially transparent to light at certain infrared wavelengths. The integrated sensor/spring contact configuration may be used in an imaging system to sense output from a light source which is used for image formation. The light source may be a laser array, LED array or other appropriate light source. The sensor is appropriately sized to sense all or some part of light from the light source. The sensor may also be sufficiently transparent so that light is not blocked from its emission path, with a contrast ratio such that it only absorbs a small fraction of light passing therethrough. An additional characteristic is that the manufacturing process is compatible with the manufacturing process for the micro-spring interconnects. Data from the sensor is used as light source correction information. This information is provided to a calibration configuration which allows for calibration of high-speed systems.

24 Claims, 11 Drawing Sheets

U.S. PATENT DOCUMENTS

| | | | |
|---|---|---|---|
| 5,914,218 A | 6/1999 | Smith et al. | 430/320 |
| 5,917,534 A * | 6/1999 | Rajeswaran | 347/238 |
| 5,917,603 A * | 6/1999 | Tanaka et al. | 356/388 |
| 5,936,657 A | 8/1999 | Fork | 347/237 |
| 5,944,537 A | 8/1999 | Smith et al. | 439/81 |
| 5,978,408 A | 11/1999 | Thornton | 372/96 |
| 6,005,276 A * | 12/1999 | Forrest et al. | 257/432 |
| 6,084,650 A * | 7/2000 | Sekiguchi | 349/106 |
| 6,343,223 B1 * | 1/2002 | Chin et al. | 600/323 |
| 6,393,183 B1 * | 5/2002 | Worley | 385/39 |

* cited by examiner

FIG. 12
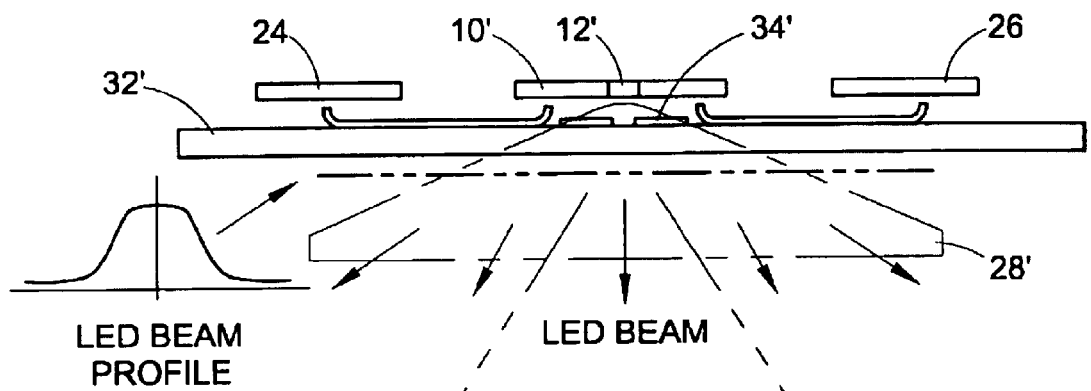
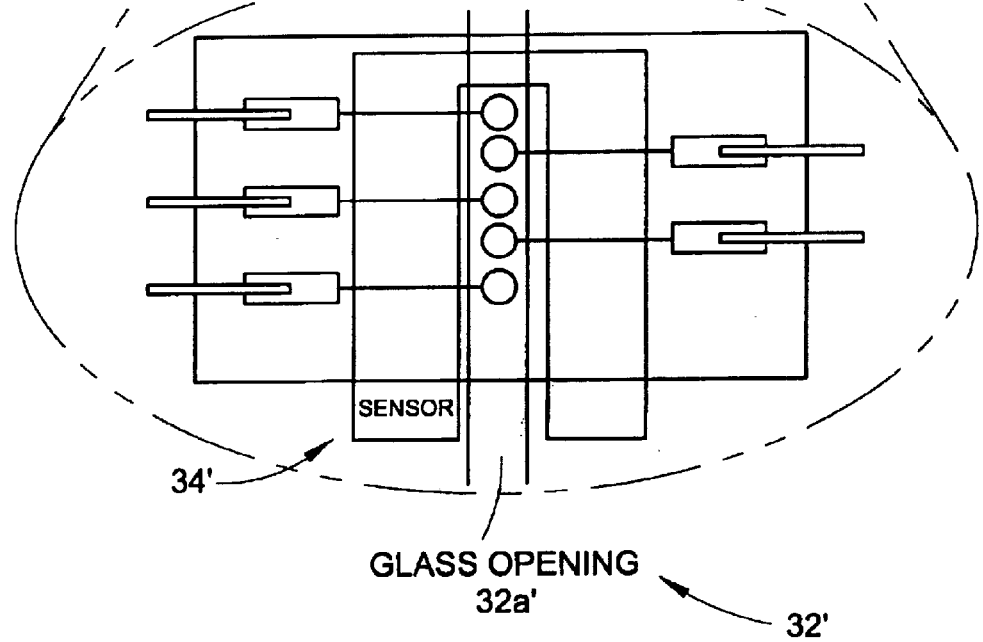
FIG. 13

AMORPHOUS SILICON SENSOR WITH MICRO-SPRING INTERCONNECTS FOR ACHIEVING HIGH UNIFORMITY IN INTEGRATED LIGHT-EMITTING SOURCES

BACKGROUND OF THE INVENTION

1. Field of the Invention

This invention relates to imaging systems using a sensor element to control the emission of at least some of the light of one or more light-emitting sources. In particular, this invention is directed to architectures, characteristics and methods of integration of a light sensor configuration with different light sources, using micro-fabricated metal spring contacts.

2. Technical Background

Image printbars which are used in imaging systems are well known in the art. Such printbars are generally comprised of a linear array of a plurality of discreet, light-emitting sources. Examples of such printbars include light-emitting diodes and lasers. A method of forming lasers in semiconductor material, which may be used in the formation of laser printbars has been taught by, for example, U.S. Pat. No. 5, 978, 408 to Thornton, entitled, "Highly Compact Vertical Cavity Surface Emitting Lasers", issued Nov. 2, 1999; and U.S. Pat. No. 5,843,802 to Beernink, et al., entitled, "Semiconductor Laser Formed by Layer Intermixing", issued Dec. 1, 1998, both commonly assigned and hereby incorporated by reference.

In a typical printbar arrangement, a large number of individual light-emitting sources are arranged in an elongated, planer array that is placed adjacent an image recording member. By providing relative motion between the printbar and the image recording member, the printbar scans the image recording member, and by selectively illuminating the individual light-emitting sources, a desired light image is recorded on the image recording member.

The selective illumination of the individual light-emitting sources is performed according to image-defining data that is applied to printbar driver circuitry. Conventionally, the image-defining data takes the form of simple binary video data signals. Those data signals may be from any of a number of data sources such as a Raster Input Scanner (RIS), a computer, a word processor, or a facsimile machine. Typically, the binary video data is clocked into a shift register. After completely shifting the data into the shift register, the contents of the shift register is transferred in parallel into latch circuits for temporary storage. Then, upon the occurrence of a start of a line signal, the latch data is applied to the printbar drive circuit which thereby illuminates the individual light-emitting sources of the printbar so as to produce a line of the latent image. A complete latent image is formed by performing successive line exposures until the image is produced.

Due to their narrow beam profile and high efficiency, photolithographically configured laser printbars have been found to provide certain advantages. Proposed laser printbars consist of an array of Vertical-Cavity Surface-Emitting Lasers (VCSELs) which may be designed with as small as 3 $\mu$m pitch. At such a pitch, a 4 cm-long laser chip would accommodate more than 13,300 individually addressable laser elements, more than necessary for 1,200 dpi printing on a standard 11-*inch*-long paper, where 13,200 elements are required. A drawback of such a large number or light sources, ultra-high density-packed, is the expectation of non-uniformity of laser responses. This non-uniformity has the potential for high spatial frequency that makes the effect on printed images noticeable to the human eye.

One manner of addressing non-uniformity is to perform a calibration when the printbar is being manufactured. A problem with this process is that it does not address aging of the lasers, fluctuations in driver chip operation or environmental variations such as temperature and humidity, among others.

A second proposal is to form a sensor or detector as part of the printbar in order to perform periodic calibrations during the lifetime of the printbar. This concept is described in U.S. Pat. Ser. No. 08/921,942, entitled, Semiconductor Laser With Integrated Detector Structure, Thornton et al., filed Aug. 27, 1997. A drawback with this proposal is the complexity of forming the device.

Similar issues may be present in many other imaging systems where one or more light-emitting sources need to be controlled in order to address issues like intrinsic non-uniformity, drift of characteristics or differential aging.

Therefore, it has been considered desirable to provide an apparatus and method to integrate a sensor element in a hybrid structure with a printbar or another compatible light-emitting source using simple patterned micro-spring metal contacts.

SUMMARY OF THE INVENTION

Provided is a hybrid structure or device integrated in a substrate, where in some cases the substrate is substantially transparent to light at infrared wavelengths. Integrated on the substrate are a plurality of micro-spring interconnects, where the micro-spring interconnects are formed of an elastic material that is initially fixed to a surface on the substrate. Upon release of a sacrificial layer a free portion moves out of the plane of the substrate in a self-assembling manner. A sensor is formed on the same substrate, and includes an active layer and contacts. The active layer may be substantially transparent to light at infrared wavelengths. The micro-spring interconnects and the sensor are integrated on the substrate and configured using a compatible manufacturing process.

With attention to a further embodiment of the present invention, a light-emitting source is provided which may be an array of individual light-emitting sources. The light sources may be lasers such as, Vertical Cavity, Surface-Emitting Lasers (VCSELs), which are formed on the substrate, and the VCSELs are capable of emitting light at an infrared wavelength. Other light sources may also be used such as an array of light emitting diodes (LEDs). The substrate holding the spring contacts and sensor, and the substrate including the light sources are aligned such that at least a portion of the light emitted by the light source is directed through the second substrate and the sensor which may be, substantially transparent at infrared wavelengths.

Separate embodiments describe similar integration schemes for less directional light-sources, such as Light-Emitting Diodes (LEDs). It is to be appreciated that the light of other wavelengths may be used in conjunction with the concepts of this invention.

BRIEF DESCRIPTION OF THE DRAWINGS

FIG. 12 depicts a block diagram of a further embodiment implementing an LED printbar according to the teachings of the present invention;

FIG. 13 is a bottom view of FIG. 12;

DETAILED DESCRIPTION OF THE EMBODIMENTS

The following description will primarily focus on a system employing a laser printbar. However, it is to be appreciated the present invention may also be used in conjunction with a LED array or other appropriate light emitting device or system, also for purposes other than printing. Further, the following discussion emphasizes that the described configuration is sufficiently transparent to be used in sensing output from a printbar. It is to be appreciated however, the concepts of the present invention may be used in applications where it is appropriate to have a sensor which absorbs a higher percentage, and possibly all light emitted by a light emitting device or system.

Figure 1:
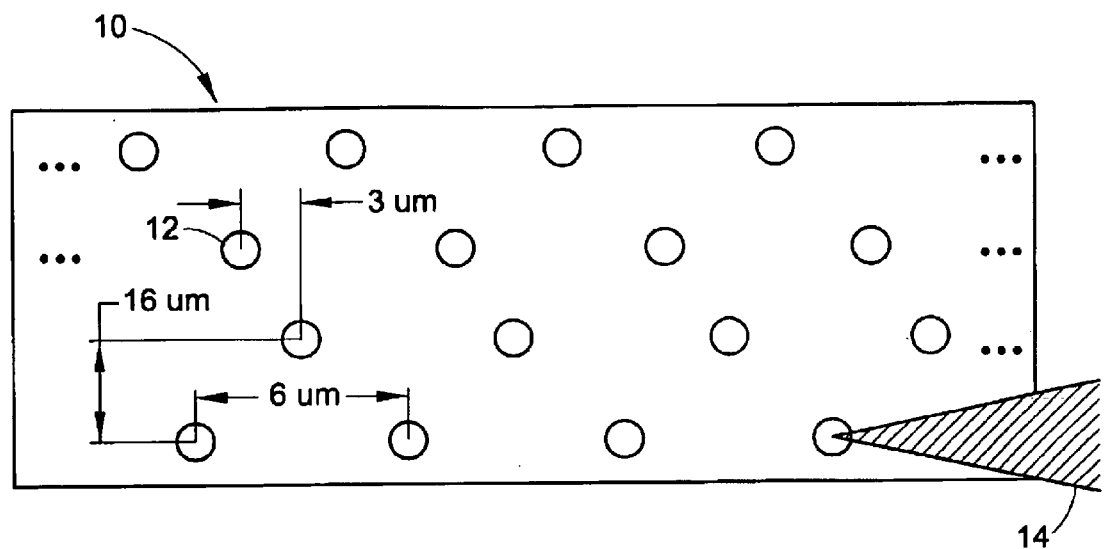
FIG. 1 depicts a portion of a laser lightbar used in association with the present invention.

Turning to FIG. 1, illustrated is a section of a laser printbar chip (also called in the following simply a printbar) 10 having individual lasers 12 interleaved at a 3 μm pitch spacing.

Printbar 10 may be designed using gallium arsenide (GaAs), and lasers 12, in one embodiment may be Vertical-Cavity Surface-Emitting Lasers (VCSELs). A laser emission cone 14 is shown for one laser to illustrate that the typical divergence of a VCSEL beam can be smaller than 20°.

Figure 2:
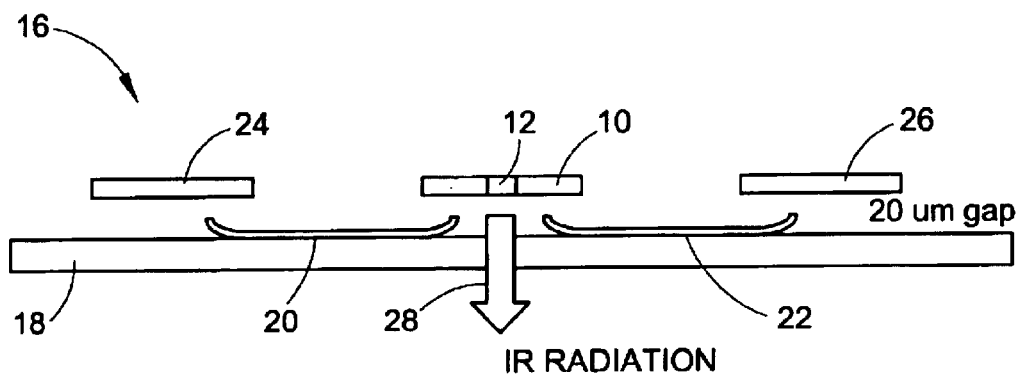
FIG. 2 shows alignment of two components that allow laser light to pass through a second substrate, partially transparent at the wavelength of the light.

FIG. 2, is a cross-section of a spring contact device 16. A first portion of spring contact device 16 is silicon or glass substrate 18 which has patterned thereon micro-spring interconnects (also called spring contacts) 20 and 22. Device 16, in one embodiment, further includes printbar 10, having an array of lasers 12, a first driver chip 24 and a second driver chip 26. Each of driver chips 24 and 26 may control operation of the lines of one side of the array of lasers 12. Spring contacts 20 and 22 are designed to provide an electrical connection between driver chips 24, 26 and printbar 10. The electrical connection between chips 24, 26 and printbar 10 can be obtained by bonding these elements to spring contacts 20 and 22. It is to be noted that although not shown, printbar 10 and chips 24, 26 may but do not need to be carried on a further-substrate. Driver chips 24, 26 receive image data which are converted into signals delivered to printbar 10. The signal driver chips 24, 26 selectively control operation of lasers 12, such as VCSEL-type lasers, which generate a light beam 28 in accordance with received image data, and emit the beam 28 through substrate 18. Therefore, it is necessary that substrate 18 be partially transparent to light in the frequency range emitted by lasers 12. In this embodiment, lasers 12 generate a wavelength shorter than 870 nanometers, in the infrared (IR) range.

One arrangement of a printbar and spring contacts is disclosed in U.S. Pat. No. 5,944,537, to Smith et al., entitled, Photolithographically Patterned Spring Contact and Apparatus and Methods for Electrically Contacting Devices, issued Aug. 31, 1999, hereby incorporated by reference.

A method of packaging devices being contacted with micro-springs is disclosed in Xerox Patent Application D/99734, to Chua et al., entitled Method and Apparatus for Interconnecting Devices Using an Adhesive, filed Dec. 15, 1999, commonly assigned and hereby incorporated by reference.

Spring contacts 20 and 22 are photolithographically patterned on substrate 18 and designed for electrical connections between devices. An inherent stress gradient in each spring contact causes free portions of the spring contracts to bend up and away from the substrate when a sacrificial layer is selectively removed. An anchor portion remains fixed to the substrate. The spring contact is made of an elastic material and the free portions, which are initially fixed, before the sacrificial layer is selectively removed from the substrate, provides for compliant contacts between devices for an electrical interconnection.

In one embodiment such contacts are designed in accordance with the teachings of U.S. Pat. No. 5,613,861 to Smith et al., entitled, "Photolithographically Patterned Spring Contact"; U.S. Pat. No. 5,848,685 to Smith et al., entitled, "Photolithographically Patterned Spring Contact"; U.S. Pat. No. 5,914,218 to Smith et al., entitled, "Method for Forming a Spring Contact"; and U.S. Pat. No. 5, 944, 537 to Smith et al., entitled, "Photolithographically Patterned Spring Contact and Apparatus and Methods for Electrically Contacting Devices", all commonly assigned and hereby incorporated by reference.

Implementing spring contacts 20, 22, allows printbar 10 to be bilaterally electrically connected to driver chips 24, 26. When printbar 10 and driver chips 24, 26 are moved to contact under the construction of FIG. 2, a gap of approximately 20 μm gap separates the surfaces of elements 10, 24 and 26 from the surface of the spring contacts' substrate, element 18. For a laser printbar and arrangement such as described in FIGS. 1 and 2, the issue of non-uniformity between the many different lasers 12 is a significant problem.

The present application describes devices and systems to correct the non-uniformity in light output, by provision of a system that uses a sensor that monitors the output of each light source to assist in calibration operations where the sensor is integrated on a substrate with spring contacts. The values resulting from the calibration are stored in an electronic look-up table, or by some other data storage method that can be referenced to normalize the output of individual light sources in-situ, by implementing periodic calibration operations.

Figures 3, 4:
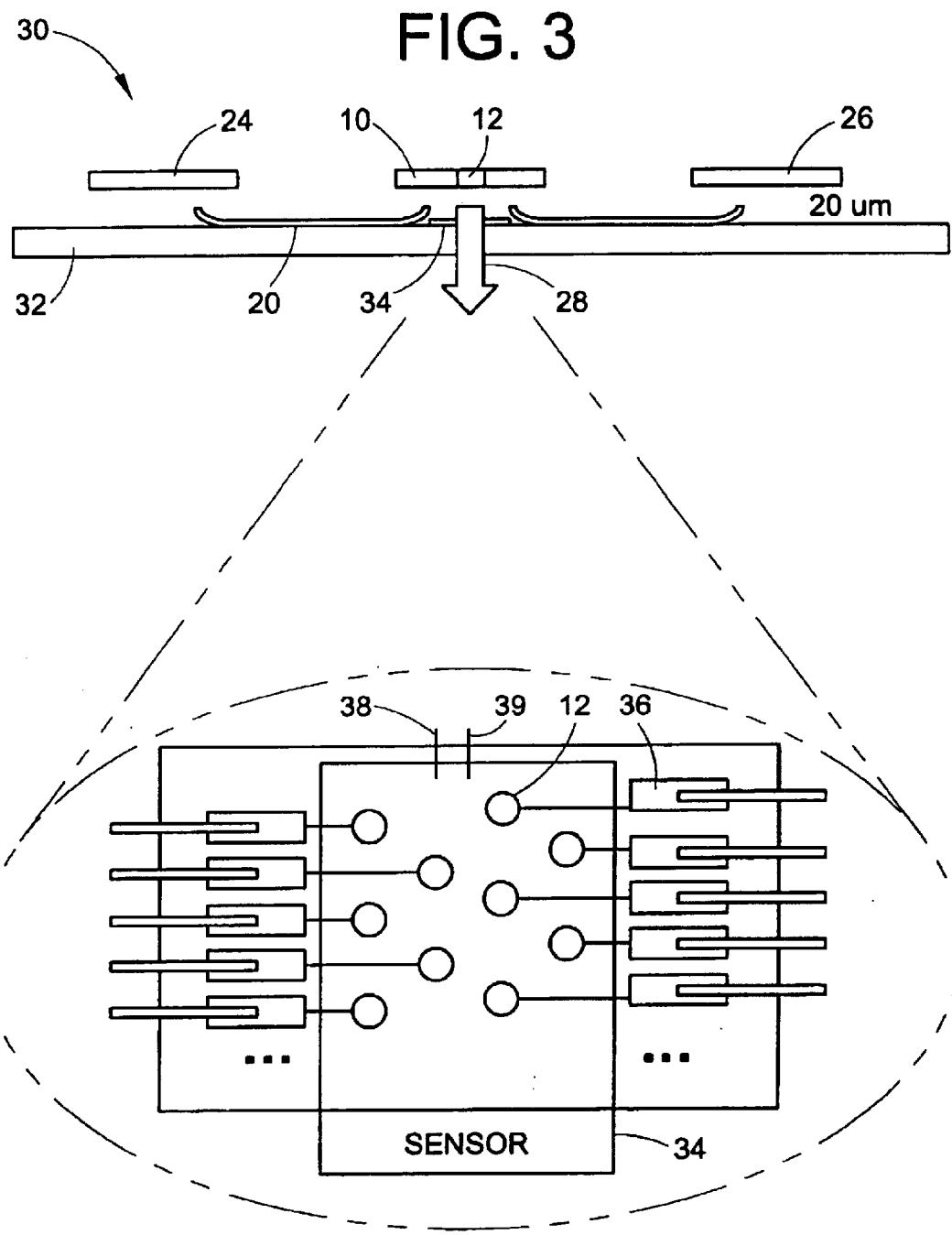
FIG. 3 depicts a block diagram of an arrangement according to the present invention.
FIG. 4 is a bottom view of FIG. 3.

FIG. 3 illustrates an embodiment of the present invention shown as a hybrid structure 30 similar to what was depicted in FIG. 2, however, in this design a sensor 34 and spring contacts 20, 22 are integrated on the same substrate 32. It is to be noted that substrate 32 as well as sensor 34 are partially transparent and laser beam (IR radiation) 28 is capable of passing substantially unobstructed through substrate 32, and sensor 34. By forming sensor 34 in a fashion which allows it to be aligned with a high degree of precision in front of lasers 12, it is possible to obtain in-situ information as to laser output for each of lasers 12, and provide periodic calibration of printbar 10 for an operational imaging device.

FIG. 4 depicts a bottom view of FIG. 3. Sensor 34 and spring contacts 20, 22 are on substantially the same plane nearest the page surface, and lasers 12 of printbar 10 for connection to spring contacts 20, 22 are at the back of the page. Contact pads 36, shown in FIG. 4, are pre-patterned on printbar 10 for connection with micro-springs 20, 22. Sensor feedback lines 38, 39 are shown extending from sensor 34. Sensor feedback lines 38, 39 carry readout current used in the calibration operation. FIG. 4 emphasizes the importance of alignment between sensor 34 and the array of lasers 12, and that sensor 34 is sufficiently sized to cover all lasers 12 in this embodiment.

FIGS. 5a–5e and 6a–6e are cross-sectional and top views of the process to form a device having contact springs 20, 22 and sensor 34 integrated on a single substrate 30. In order to accomplish this integration, it is necessary for the sensor to be configured to have certain unique properties. In this embodiment, the first characteristic is that the sensor be made large enough to be aligned with all lasers 12 of printbar 10. Presently a printbar having a laser array of approximately 4 cm by 200 $\mu$m is anticipated for use in an imaging device.

The second characteristic requires the sensor to be partially transparent to the laser light. As previously noted, this requirement allows for the operation of calibration without moving the printbar out of the printing area.

The third characteristic is for the sensor to have a high "contrast ratio", also called "light-to-dark" response. Since the sensor will only absorb a fraction of the light passing therethrough, due to its partially transparent nature, it must be able to work even with very small signals. An ideal sensor will have no current flowing when no light exists. Amorphous silicon (a-Si: H) sensors are able to approach this ideal state.

The fourth characteristic is that the manufacturing process for the sensor must be compatible with the manufacturing process of spring contacts.

Further, in this embodiment, the fabrication process depicted in FIGS. 5a–5e and 6a–6e, must ensure that when the integrated device is formed and contacted to a printbar, the sensor and spring contacts are properly aligned in relation to the lasers and the driver chips.

Figure 6A:
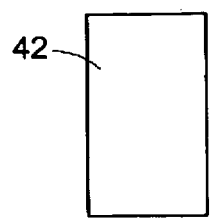
FIGS. 6a–6e are top views of FIGS. 5a–5e.

With particular reference to the process flow for the construction of a device formed on a substrate integrating both spring contacts and a sensor, in a first stage (stage 1), on a transparent silicon or glass substrate 40 is deposited or grown a transparent/conductive layer 42, such as iridium tin oxide (ITO), which is patterned in accordance with known techniques. Transparent/conductive layer 42 needs to be transparent such that it does not block light emitted from lasers 12 (of FIGS. 3 and 4), and is required to be conductive as it will act as a first electrode of the sensor. FIG. 6a depicts a top view of stage 1.

Figure 5A:
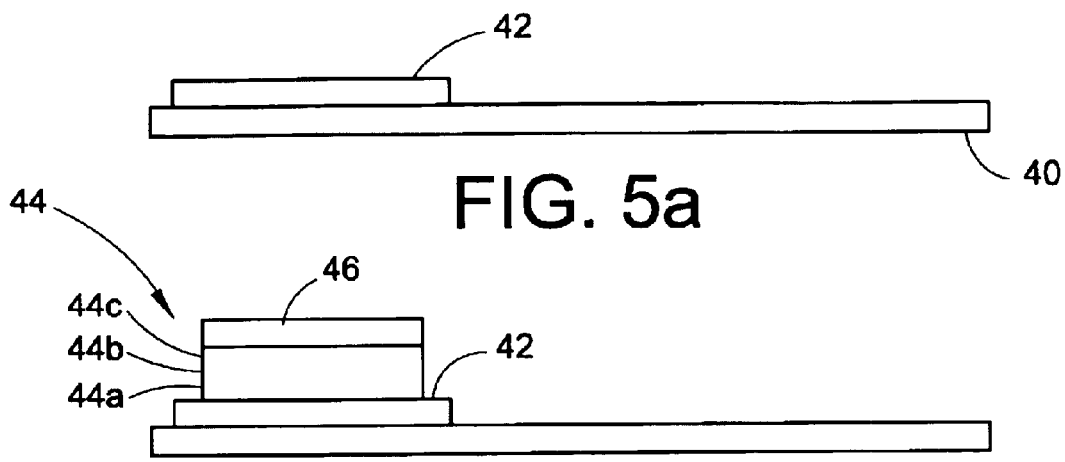
FIGS. 5a–5e illustrate process steps for the formation of a hybrid device according to the teachings of the present invention.
Figure 5B:
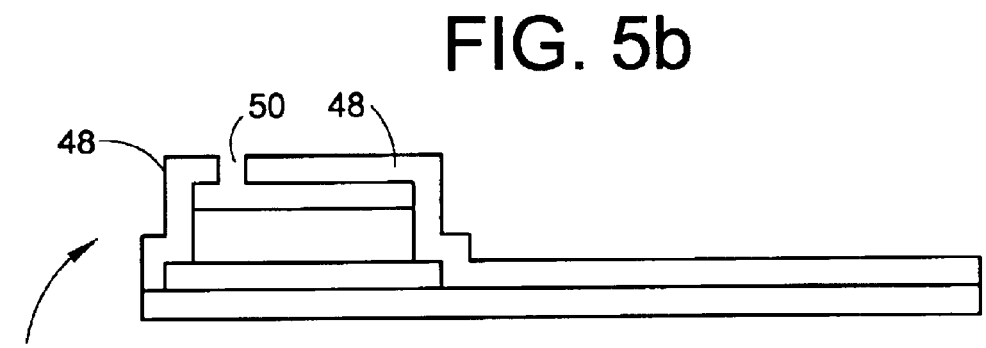
Figure 6B:
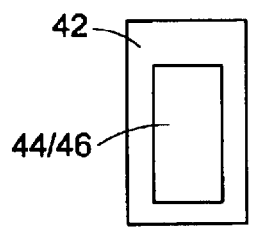

Turning to stage 2, illustrated by FIGS. 5b and 6b, a hydrogenated amorphous silicon sensor (a-Si: H) component or active layer 44 is grown on top of the first transparent/conductive layer 42, a-Si: H sensor component 44 is usually comprised of three layers. The first layer 44a, is a $n^+$-doped layer of material, typically less than 1,000 angstroms in thickness. Though not limited thereto, the first layer 44a may be a n phosphorous-doped amorphous silicon, or $n^+$arsenic-doped silicon. A second layer 44b is intrinsic amorphous silicon, of a thickness less than a micron, preferably in the range of 3,000–5,000 angstroms. The third layer 44c of sensor element 44 is a $p^+$-doped amorphous silicon of approximately 100 angstroms thickness. An example of a $p^+$-doped amorphous silicon which may be used as third layer 44c is $p^+$boron-doped amorphous silicon.

Following deposition of sensor element 44, a second transparent/conductive layer 46 is deposited on top of sensor element 44. Sensor element 44 and second transparent/conductive layer 46 may be patterned together in a single process or separately. Further, sensor element 44 in the present embodiment is an amorphous silicon sensor, which is opaque in visible light, and transparent at IR wavelengths.

Figure 5C:
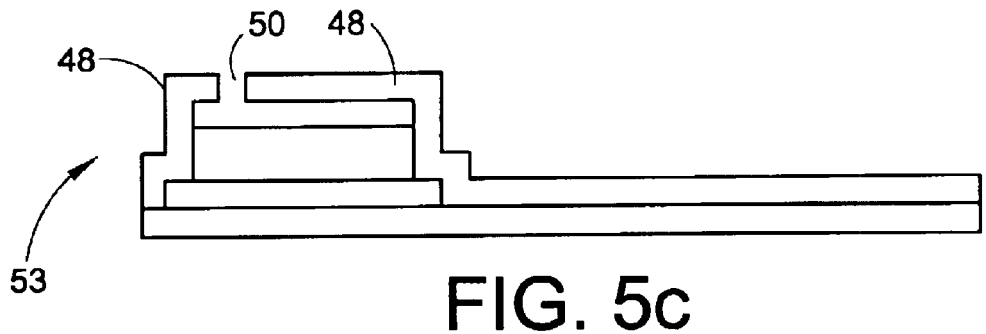
Figure 6C:
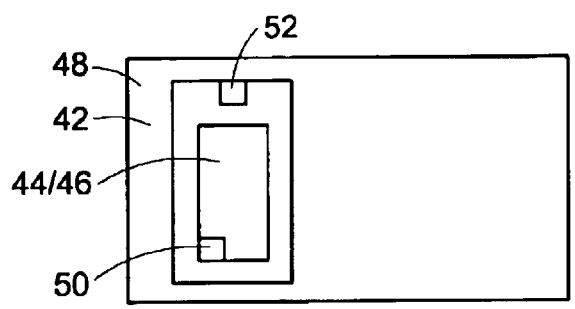

Turning to step 3 of the process, shown in FIGS. 5c and 6c, passivation/release layer 48 is deposited. Passivation/release layer 48 is required to meet the manufacturing requirements of both the sensor configuration and spring contacts. One type of substance that meets this requirement of compatibility is amorphous silicon-nitride. Oxynitride, and polyamide are among other possible choices. In particular, layer 48 acts as a passivation layer for the sensor by being electrically insulating and is transparent in the wavelength range emitted by the lasers which the sensor is to be associated. Layer 48 also functions as a release/sacrificial layer that may be used in the configuration of the spring contacts, as will be described in greater detail below.

Two vias are provided through passivation/release layer 48 to allow contact to transparent/conductive layers 42 and 46. First via 50 and second via 52 may be seen clearly in top view FIG. 6c. The first via 50 provides an opening to second transparent/conductive layer 46 and second via 52 provides an opening to first transparent/conductive layer 42. These openings are necessary since the passivation/release layer 48 is formed from an electrically insulating material and, since layers 42 and 46 act as electrodes of the sensor, these openings provide access to layers 42, 46.

At this point, an electrically protected sensor 53 is formed consisting of first transparent/conductive layer 42, sensor element 44, second transparent/conductive layer 46 and passivation/release layer 48, and vias 50, 52 which provide electrical access to sensor 53.

Figure 5D:
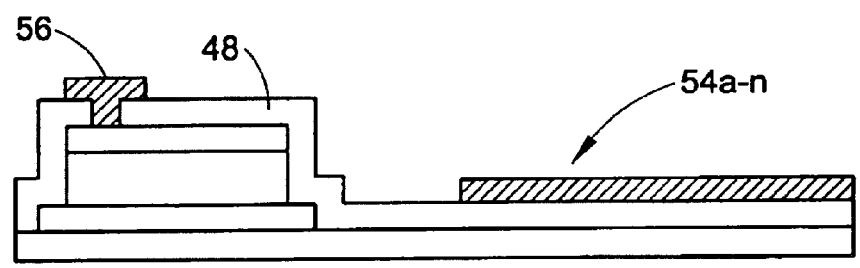
Figure 6D:
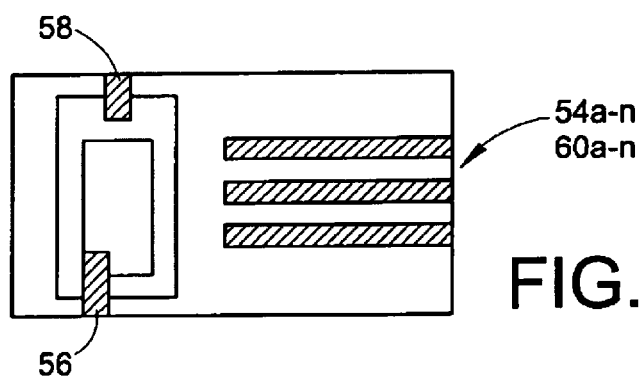

Attention is now directed to stage 4 of the process, as illustrated in FIGS. 5d and 6d. In this stage, metal patterns 54a–n, 56, and 58 are deposited directly onto passivation/release layer 48 and into vias 50 and 52. Metal patterns 54a–n, 56, and 58, are deposited during the same processing steps and are made of the same metal layers, formed to have an inherent stress gradient.

In one preferred embodiment, metal patterns 54a–n, 56, and 58 are made of an extremely elastic material, such as a chrome-molybdenum alloy or a nickel-zirconium alloy. Depositing of the metal patterns 54a–n, 56, and 58 may be achieved by many methods including electron-beam deposition, thermal evaporation, chemical vapor deposition, sputter deposition or other methods.

The metal layers that compose patterns 54a–n, 56 and 58 may be thought of as deposited in several sub-layers to a final thickness. A stress gradient is introduced into the metal layers by altering the stress inherent in each of the sub-layers. Different stress levels can be introduced into each sub-layer of the deposited metal during the deposition processing. After metal layers for patterns 54a–n, 56 and 58 have been deposited, they are patterned by photolithography into desired designs.

The process of depositing metal layers for patterns 54a–n, 56 and 58 in separate sub-layers results in the patterns 54a–n, 56 and 58 having a stress gradient which is compressive in a lower metal layer becoming increasingly tensile toward the top metal layer. Although the stress gradient urges the metal layers that compose patterns 54a–n, 56 and 58 to bend into an arc, patterns 54a–n, 56 and 58 adhere to the passivation/release layer 48 and thus lays flat.

Figure 5E:
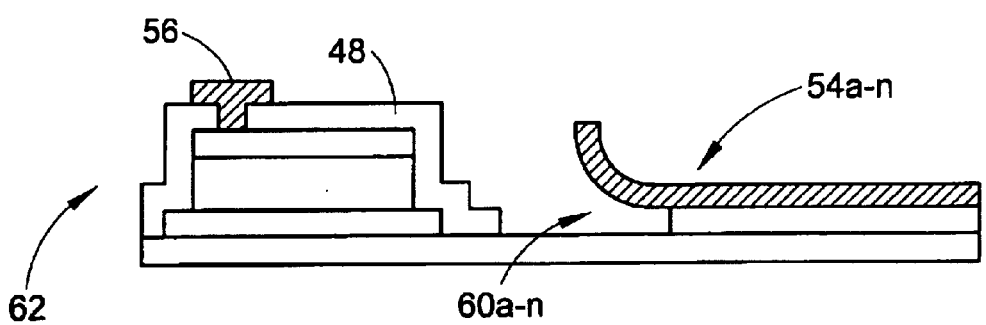
Figure 6E:
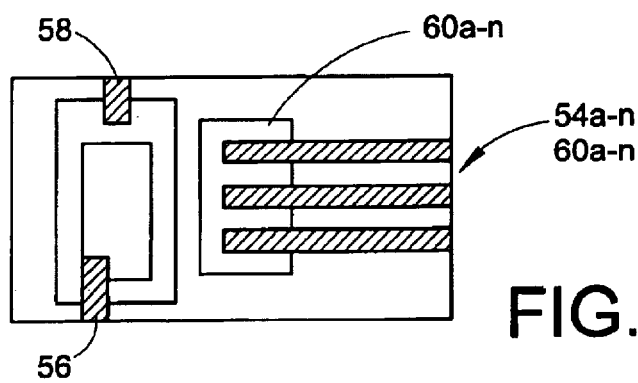

In step 5, as depicted in FIGS. 5e and 6e, free portions 60a–n of metal patterns 54a–n are released from passivation/release layer 48 by a process of undercut etching. Passivation/release layer 48 is typically deposited by plasma chemical vapor deposition (PECVD) and can give passivation/release layer 48 a fast etch rate characteristic. After proper photolithography a selective etchant, typically a HF-based solution, may be used to etch the passivation/release layer 48. The etchant is called a selective etchant because it etches passivation/release layer 48 faster than the selective etchant removes metal from metal patterns 54a–n. By means of the etch process free portions 60a–n are released from passivation/release layer 48 and allowed to bend up and away from substrate 40 due to the stress gradient in metal layers 54a–n.

Another wet etchant which may be used is a buffered oxide etchant (BOE) which is hydrofluoric acid combined with ammonium fluoride. Also proper choice of the passivation/release material can allow a dry-etching technique for the release process.

Metal patterns 56, 58 comprised of the same stressed metal design of patterns 54a–n, are not released, and are used as sensor readout lines and contact elements to the first transparent/conductive layer 42 and second transparent/conductive layer 46, which act as electrodes for sensor 53.

FIGS. 5e and 6e depict a sensor/contact semiconductor integrated device 62 which carries sensor 53, an amorphous silicon active device, together with stressed spring contacts 54a–n designed to contact devices on a separate substrate.

It is again worth noting that substrate 40, first transparent/conductive layer 42, second transparent/conductive layer 46, and passivation/release layer 48 are each transparent at the frequency of operation of VCSEL lasers 12 of printbar 10. Sensor element 44 is partially transparent.

Interference is a phenomenon that can alter the reflection from a surface. It can be designed beneficially to obtain anti-reflection characteristics, reducing reflection losses.

Light being directed to sensor 53 may either be absorbed, passed through, or reflected. Reflection of light is undesirable as compared to the other possibilities, since if light is absorbed, the sensor is using it to determine an appropriate feedback to the system, and if light passes through, it is being used by the target device, for instance to create a latent image on an electrostatic drum or for other useful purposes. On the other hand, reflected light is wasted light.

The interference phenomenon is dependent upon the thickness of layers comprising sensor 53 and the wavelength used by laser 12. Sensor 53 has been designed in consideration of the interference phenomenon, and the thickness of the layers have been adjusted to avoid or minimize undesirable reflection for the light frequency of lasers 12. In particular, passivation/release layer 48 has a thickness of 3,000 angstroms to obtain the desired non-reflective effect.

Figure 7A:
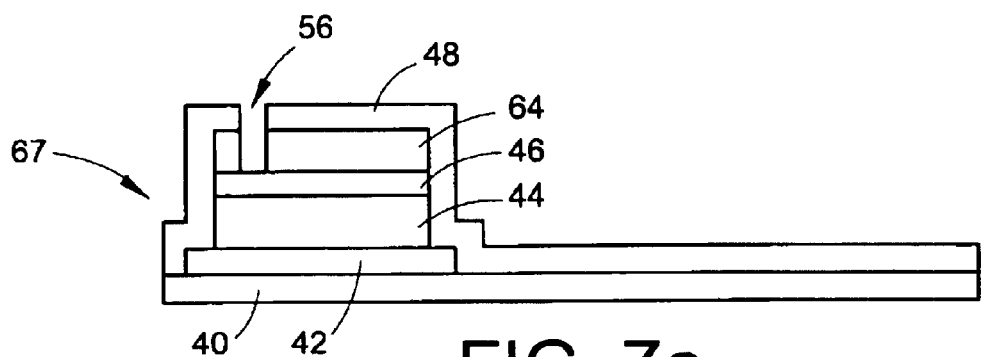
FIGS. 7a–7b shows selected process steps of a second embodiment according to the teachings of the present invention.
Figure 7B:
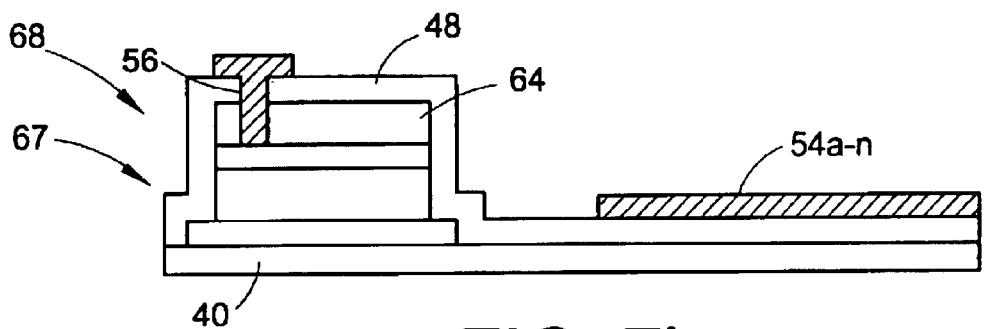
Figure 8A:
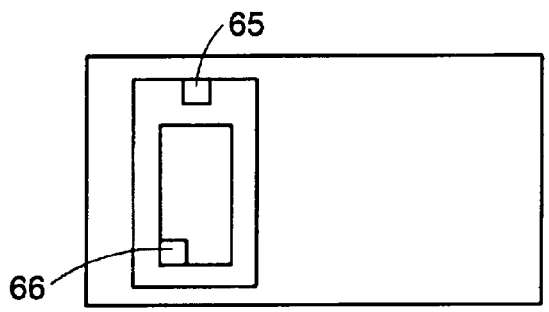
FIGS. 8a and 8b are top views of the process steps of FIGS. 7a–7b.

Turning to FIGS. 7a–b and 8a–b, a second embodiment of the present invention is illustrated. It is known that prior to a laser starting its lasing process a phenomenon takes place known as spontaneous emissions. During the spontaneous emissions, light in the visible range from the laser may be emitted. It is undesirable to have this light, as well as light of any other undesired wavelength, reaching sensor element 44. Therefore, to further improve the reliability of the present invention, when IR lasers are used, an additional processing step may be added. Particularly, after the application of second transparent/conductive layer 46 (as depicted in FIG. 5b), a visible light absorption layer 64, which may be hydrogenated amorphous silicon (a-Si: H), is deposited on top of second transparent/conductive layer 46 prior to sensor element 44 and second transparent/conductive layer 46 being patterned. Visible light absorption layer 64 is opaque to visible light, and transparent to IR light. Once sensor element 44, second transparent/conductive layer 46 and visible light absorption layer 64 have been deposited on top of first transparent/conductive layer 42, they are patterned. Next, and similar to FIG. 5c, passivation/release layer 48 is deposited over this patterned stack, and over transparent/conductive layer 42 and substrate 40. Thereafter, and as shown in FIGS. 7a and 8a, vias 65 and 66 are provided through passivation/release layer 48 and visible light absorption layer 64, to provide access to transparent/conductive layers 46 and 42. By this design, an electrically isolated sensor 67 is formed.

Figure 8B:
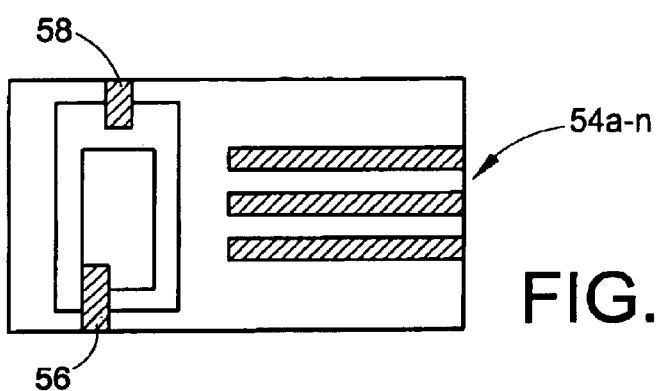

As depicted in FIGS. 7b and 8b, stressed metal layers for patterns 54a–n and 56 and 58 are deposited in a manner similar to that discussed in relationship to FIGS. 5d and 6d. Thereafter, selected portions of patterns 54a–n are released by the etching process previously discussed, to form integrated device 68.

The embodiment shown in FIGS. 7a–7b and 8a–8b adds visible light absorption layer 64, which provides a manner of inhibiting spontaneous emissions generated visible light from impinging upon sensor element 44. This avoids false readings from sensor 67, which would negatively impact the calibration process.

When the laser goes above the laser threshold, spontaneous emissions may still exist, too. An ideal sensor would be "blind" to the spontaneous emission component, i.e. it would have a very narrow bandwidth. Therefore it would read nothing but the lasing component of the laser operation. Absorption layer 64 is able to absorb the continuing spontaneous emissions, so that it does not reach sensor element 44.

In one embodiment, absorption layer 64 is a-Si: H of 1 micron thickness, or preferably approximately 3,000–5,000 angstroms, thick. Other materials having the capability of absorbing undesired light and allowing the desired wavelength to pass may also be used. It is noted that amorphous silicon will change in sensitivity dependent upon the wavelength of light. By absorbing the visible light, a more accurate reading is obtained. In a further embodiment, visible light-absorbing layer 64 may be constructed directly on the output of lasers 12.

Figure 9:
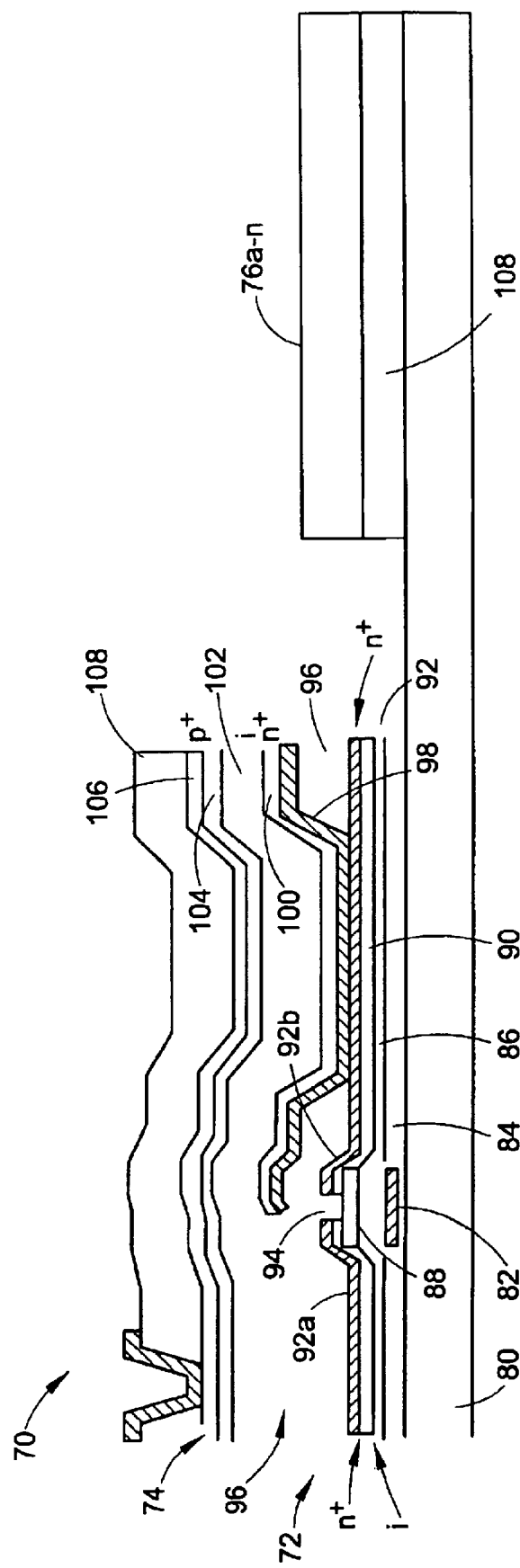
FIG. 9 depicts a third embodiment in accordance with the teachings of the present invention.

Turning to FIG. 9, the cross section of an integrated device 70 is illustrated having a transistor, e.g. Thin-Film Transistor (TFT) switch 72 configured below a semi-continuous sensor 74, which is integrated with contact springs 76a–n, similar to spring contacts 54a–n of FIGS. 5e and 6e. In this embodiment, p-i-n-amorphous silicon (a-Si: H) sensor 53 of FIGS. 5e and 6e is replaced by a more elaborate composition. The combination of TFT switch 72 and semi-continuous sensor 74 are meant to be shown as a pixel, or picture element of a 1- or 2-dimensional array, enclosed in a layer of passivation, for operation as an active matrix sensor.

With more particular attention to the construction of device 70, deposited on a transparent substrate 80 such as glass, is a gate contact 82 formed of a transparent metal, such as Chronium (Cr). Metal layer 82 is deposited in a thickness of approximately 3,000 angstroms, and acts as the gate contact of TFT switch 72. Deposited over metal portion 82, and remaining portions of substrate 80, is a first transparent/conductive layer 84, such as nitride, oxynitride, polyamide or other appropriate material, which is typically deposited to approximately 3,000 angstroms in thickness. Deposited over layer 84 is a layer 86 of an intrinsic hydrogenated amorphous silicon (a-Si: H), typically 500 angstroms thick.

An island of nitride (oxynitride, polyamide, etc.) 88 is deposited and patterned over gate contact 82 on the a-Si: H layer 86. Island 88 is typically deposited to a thickness of approximately 2,000 angstroms.

A layer of n-doped a-Si: H 90 is then deposited and selectively patterned to a thickness of approximately 1,000 angstroms over nitride island 88 and layer 86.

Next, a layer of transparent conductor 92 is deposited on top of island 88, and an opening 94 is patterned to create two electrodes 92a, 92b from layer 92. The metal of layer 92 may typically be a Indium Tin Oxide (ITO). Patterns 92a and 92b act as the source and drain contacts for TFT transistor 72. A passivation layer 96 is patterned on top of conductor layer 92 and may typically by oxynitride of approximately 1 micron, or alternatively a polyamide layer of approximately 2.3 microns thickness. A via in layer 96 is opened, such that a transparent/conductive layer 98, typically made of ITO, and an n$^+$-doped amorphous silicon layer 100, are deposited and patterned in a mushroom-shape inside and over the via. Layer 98 functions as the bottom electrode of sensor 74. Layer 98 is deposited such that, in the via, it is in contact with layer 92 and over remaining portions of layer 96. The n$^+$-doped contact layer 100 is typically 700 angstroms thick.

A continuous layer of intrinsic amorphous silicon (a-Si: H) 102 is deposited over the n$^+$-doped contact 98 and portions of the passivation layer 96. This layer of sensor 74 has a typical thickness of approximately 1 micron.

A p$^+$-doped layer 104 is then deposited over intrinsic a-Si layer 102 to a thickness of approximately 100 angstroms. A transparent/conductive layer 106, typically made of ITO and 5,500 angstroms thick, acts as a top electrode of sensor 74. Thereafter, a top passivation/release layer 108 is deposited and patterned in accordance with the description of FIGS. 5d–5e and 6d–6e, and metal layers are deposited in accordance with the previous embodiments.

This embodiment of integrated detector/contact spring device 70, therefore, consists of a TFT transistor 72 which is connected to the semi-continuous sensor 74 through the opening created in passivation layer 96. The sensor 74 is otherwise separated from the TFT on a top level by portions of passivation layer 96 that have not been etched away.

After formation of an integrated detector/contact spring device, such as devices 62, 68 or 70, alignment is made with a substrate carrying printbar 10 or the light source of interest. It is then desirable to determine the performance of a system configured by electrically contacting printbar 10 with driver chips 24, 26 (FIG. 3) through use of integrated sensor/contact spring devices 62, 68 or 70. Therefore testing was undertaken to determine the operating capability of sensor 53 in a system as described.

Initially, a given power was applied to a single laser 12, and the output signal generated by sensor 53 was monitored as a result of the input power. Typically, for 1 milliwatt of light output, the signal of the photo-current provided by sensor 53 was approximately 1 micro-amp of photo-current. The dark current, the current that is produced when no light exists, was 1 pico-amp or less.

For the sensor size suggested in the case of the 1,200 dpi- the contrast ratio between the sensor current under laser illumination and in the dark is therefore about 1,000,000, allowing in principle for 10-bit resolution. In this embodiment, a 4-bit correction has been used and can already provide substantial quality improvement to the system.

Turning to the calibration process, it is noted that in a first embodiment, calibration of lasers 12 of printbar 10 is accomplished by sensing and calibrating a single laser at a time. Particularly, sensors (34, 34', 53, 67, 74) are sufficiently sized to be placed in front of all lasers 12 of printbar 10. In one calibration scheme, the imaging device is not being used to print an image during calibration. Rather, the calibration process takes place during a time when image processing is not occurring.

In the embodiment describing the laser printbar, it is assumed sensors 53, 67, 74 are rectangular sensors of approximately 4 cm by 200 micrometers, which is large enough to intercept 100% of the laser beams diverging from printbar 10, for a substantially 4 cm-long laser array. The typical divergence of the VCSEL's beam was noted to be smaller than 20°.

The transparency of the amorphous silicon film ensures sufficient laser radiation to exit from the sensor to allow for printing while low (10 pA/cm$^2$) dark leakage current of sensors 53, 67, 74 maintains the contrast ratio (or light-to-dark ratio) at a high enough value for operation.

Figure 10:
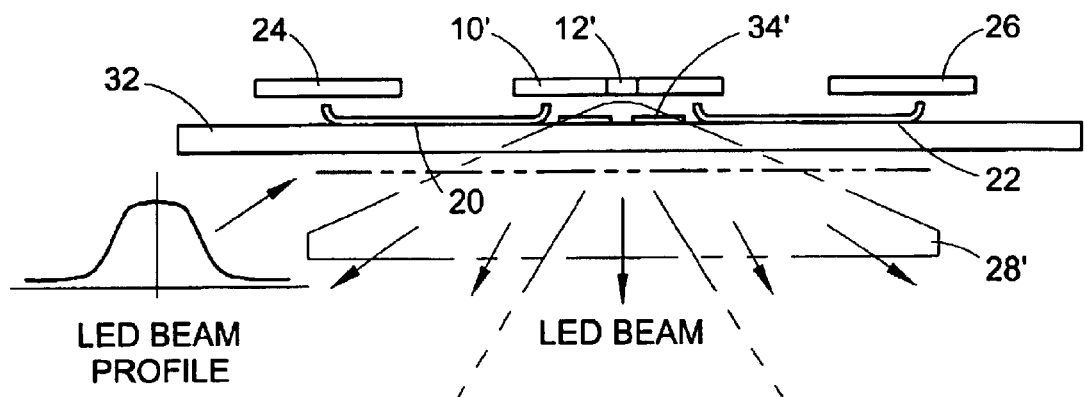
FIG. 10 is a block diagram of an arrangement implementing an LED printbar according to the teachings of the present invention.
Figure 11:
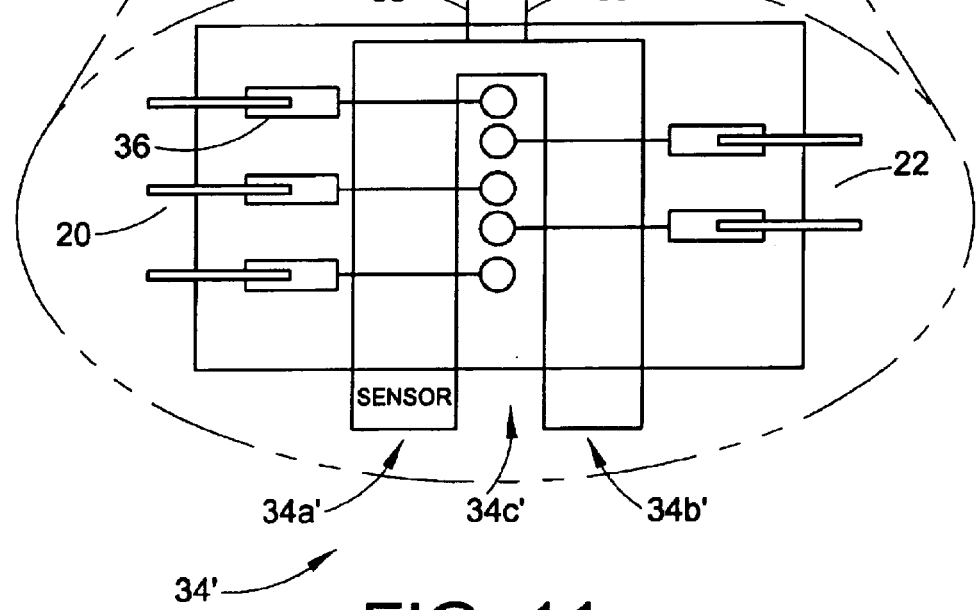
FIG. 11 is a bottom view of FIG. 10.

Turning attention to FIGS. 10 and 11, a configuration similar to that shown in FIGS. 3 and 4 is depicted, and the same elements are provided with the same numbers. In this embodiment, the printbar is an LED printbar 10'. It is noted that light from an LED is non-coherent unlike the light from a laser and it is typically much more diverging. This is illustrated by light beam 28' of FIG. 10. While an LED lightbar may be incorporated into a configuration such as shown in FIGS. 3 and 4, the particular characteristics of LED light are more fully taken advantage of in the present embodiment.

Sensor 34', as shown more particularly in the bottom view of FIG. 11, is manufactured having an elongated open "o"-shaped configuration, one end of which is shown in the figure. It runs along the full length of the LED printbar, with two leg portions 34a' and 34b', whereby an opening 34c' is provided over the LEDs 12' of LED printbar 10'. Such a design recognizes the diverging characteristics of an LED light source, and positions sensor 34' such that sensing elements 34a', 34b' are at the edges of the LED light beam 28'. By this design, the direct LED light path, which is emitted through the open section 34c', is undisturbed and therefore substantially 100% of this light source may pass to the intended target. Sensor 34', is able to detect the value of the light being emitted by sensing the light in the shoulder or edge portions of light beam 28'.

It is to be noted that using such a design, all of the light from the shoulder portions of beam 28' may be absorbed and sufficient LED light may still be emitted through opening 34c' to allow sufficient light emission for the intended target. Depending on the system it will be embedded in, this can allow sensor configurations where the transparency to the light is almost zero. In situations where the entire portion of the shoulder beams of light 28' is not absorbed, due to the incoherent nature of the LED light, that portion of the light passing through sensor 34' will join the central portion of beam 28' which has not been disturbed by sensor 34'.

The foregoing design is particularly useful in connection with LED printbars since they have a less powerful light beam than a laser light beam. Thus, by not absorbing the center part of the light emission, a more efficient imaging system is provided.

Turning to FIGS. 12 and 13, an embodiment similar to that shown in FIGS. 10 and 11 is provided. However, in these figures, in addition to sensor 34' being provided with an opening, i.e. the elongated open "o"-shaped configuration, a similar concept is implemented with the substrate 32'. This design is particularly illustrated in FIG. 13 where it is shown that substrate 32' is provided with a glass opening 32a'. It is noted that while FIG. 12 appears to have substrate 32' as two separate elements, in actuality and as illustrated more completely in FIG. 13 there is simply an intermediate rectangular section of glass substrate 32' which has been removed by any suitable etching technique, such as wet etching. FIG. 12 describes a section across the integrated device.

Figure 14:
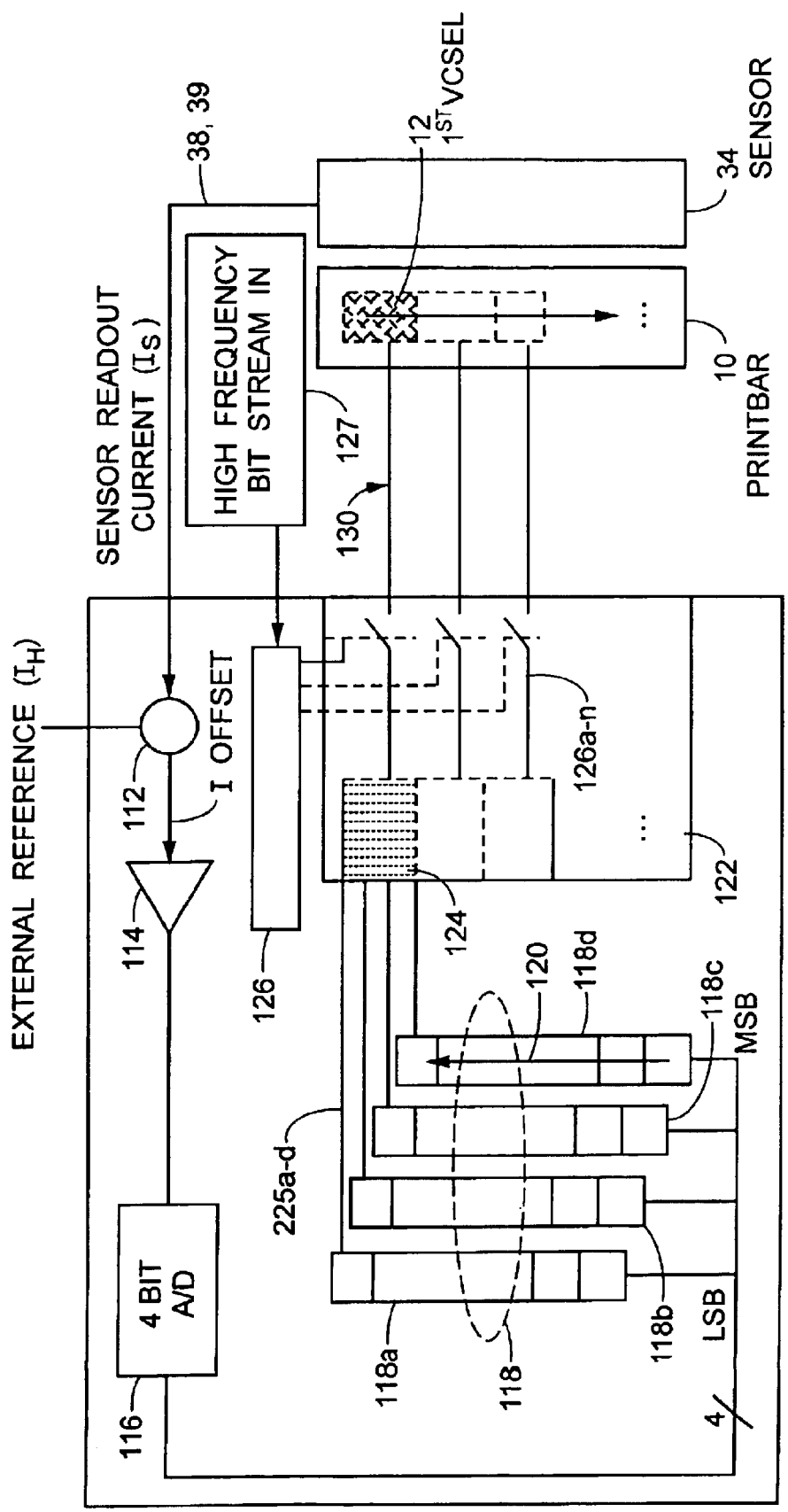
FIG. 14 illustrates a block diagram of an imaging system designed for calibration of light signals implementing concepts of the present invention.

Turning attention to FIG. 14, a block diagram of a calibration/printing system 110, according to the present invention is depicted. Driver chip 24 (which could also be driver chip 26) is shown in association with printbar 10 and sensor 34, (sensors 34', 53, 67, 74 or other appropriately formed sensor may also be used).

The only data link between printbar 10 and sensor 30, through which information is passed, is the light transfer. Sensor 34 generates a readout current $I_S$ which is carried on feedback circuit lines 38, 39. This sensor readout current $I_S$ is delivered to a comparator 112, and compared to an external reference current $I_R$. The value of external reference $I_R$ is a parameter of the system set by a user or during system design. Comparator 112 measures the difference between readout current $I_S$ and reference current $I_R$ to obtain an offset current $I_{OFFSET}$, which is delivered to current/voltage converter 114, and this voltage is in turn provided to analog-to-digital (A-/D) converter 116. In this embodiment A-/D converter 116 is shown as a four-bit A-/D converter. These four bits are routed to a set of low frequency shift-registers being used as an electronic look-up table 118, which in this embodiment is comprised of four shift registers 118a–d. Each bit of data enters the shift registers and ripples through as shown by arrow 120.

In one embodiment, for a printbar having approximately 14,000 lasers, each shift register 118a–d may be a 14 k-bit shift having a serial input and a serial output. The outputs of shift registers 118a–d are supplied, in parallel, as a 4-bit word, to driver 122. In the example in FIG. 14, the output lines from the top stage of shift registers 118a–d are delivered to the driver at a stage 1 position 124, via input lines 125a–d.

In an embodiment with 14,000 lasers, there will be approximately 14,000 stages each associated with a specific laser of printbar 10. Therefore, each stage is connected or associated with a specific laser. For each stage, e.g. stage 124, four bits from (MSB to LSB) are provided by shift registers 118a–d. Each 4-bit value in each stage acts as the correction value for that particular laser. It is to be appreciated that while four bits are described in this embodiment, systems with a larger or smaller bit number may also be implemented.

In the above-described section, the steps from sensing data representative of laser output, until a correction value is loaded into one of the stages of driver 122, are accomplished at a comparatively slow rate. For example, a calibration operation as described for all lasers in a 14,000 array may take approximately 1–2 seconds.

In the case of a printbar, since calibration can be programmed to take place upon either start-up of the machine, during a rest period, or at predetermined times when the machine is not operating, the time to acquire and store the information into 4-bit driver 122 is not critical. Through this process 4-bit driver 122 has its inputs set to the correction values for each laser of printbar 10. It is to be appreciated, however, that while this embodiment uses a separate time sensor readout and correction of the driver's inputs, with sufficiently timed actions and appropriate data handling, high-speed real-time, or near real-time calibration may be accomplished with a similar approach.

High-speed printers run data streams at a frequency much greater than that just described for this embodiment. Even if the calibration operation is not designed to keep up with the speed of the high-frequency data stream, by the process now described, this differential in speed is not critical as the correction values stored in the stages such as stage 124, are already set at the inputs of the driver 122 when the high frequency data stream from shift register 126 is enabled. The values are set to stage 124, via input lines 125a–d from low frequency shift register 118.

Turning now to a printing process using a printbar with approximately 14,000 lasers, data will be supplied via a high-frequency bit stream 127, which may be provided through a print processor of a computer or other digital device. The high frequency data is supplied to a high frequency 14 k-bit shift register 126 with a parallel output to form enable/disable outputs 126a–n. The correction information stored at the inputs of stage 124 is used to adjust, with respect to a predetermined mean value, an activation signal 130a–n supplied to printbar 10, in order to generate an appropriate level of output for the corresponding laser. The outputs 126a–n of high frequency shift register 126 are used to enable/disable the corrected current, for each stage, from being delivered from the driver to the corresponding laser. It is noted that in this embodiment 126a–n represents approximately 14,000 outputs and 130a–n represents approximately 14,000 signals.

The correction value set at the inputs of the stages, such as stage 124, therefore are stable values, held in the electronic look-up table 118.

Figure 15:
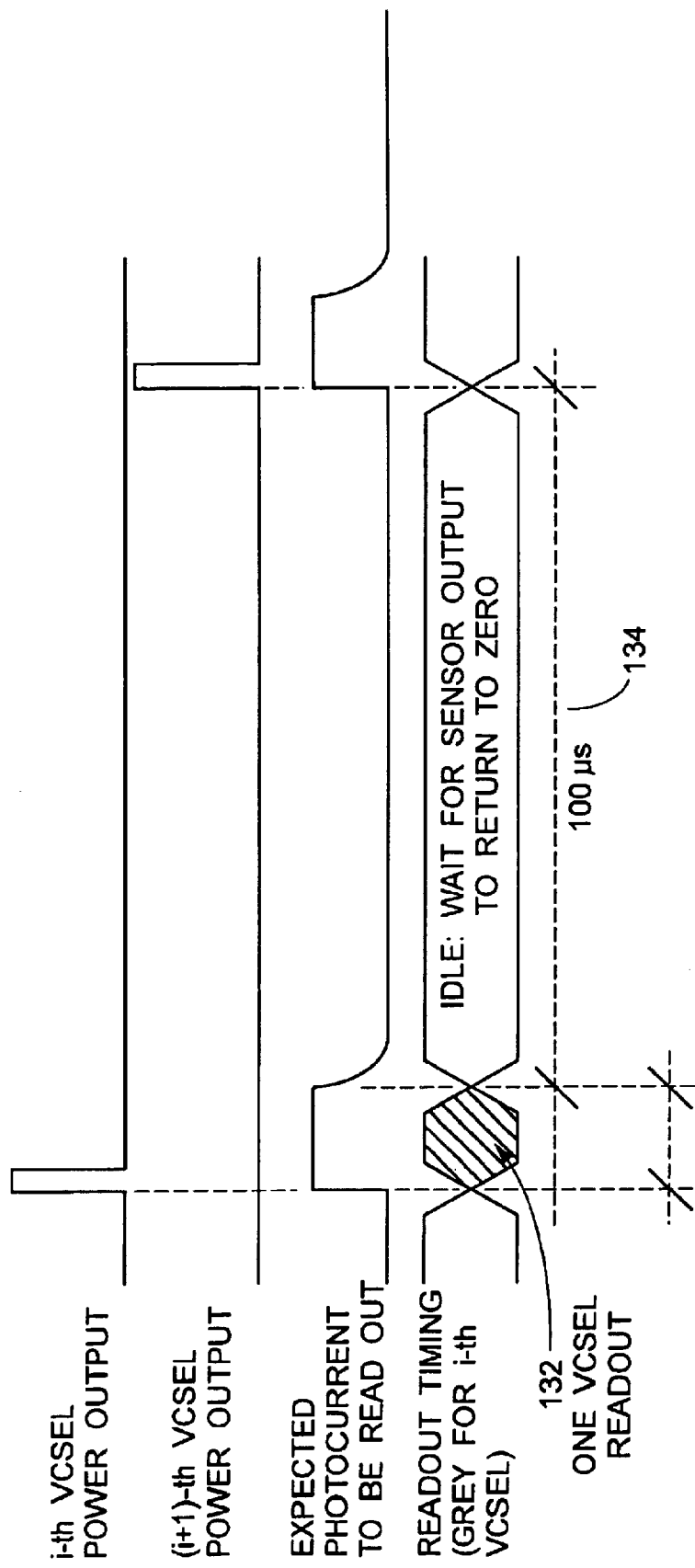
FIG. 15 depicts timing of light and current readouts used in the calibration operation of the present invention.

Returning attention to the calibration procedure, lasers 12 are, in this scenario, activated in a sequential one-at-a-time fashion and sensor 34 reads out the photo-current produced by each laser one at a time. The time response of the photodiode to the radiation pulse is virtually immediate and is limited by the readout electronics. The photo-current turn-off is related to the transient time of holes (slower photo-carriers) through the depleted intrinsic region. As illustrated in FIG. 15, amorphous silicon transport properties very safely allow readout times of about 10 μs, 132. A 100 μs idle time, 134 for a VCSEL type laser combined with an amorphous silicon $p^+$-i-$n^+$ photo-diode is considered desirable for clean operation. Given a sensor capacitance of 0.8 nF (as calculated from a 10 nF/cm² typical capacitance), the resistance of a read-out circuit can be as large as 1 KOhms to widely maintain the 10 μs readout constraint. In reality, the current is flowing into a virtual ground and resistance can therefore be made small.

The use of a single sensor for all the VCSEL lasers allow for an ease of fabrication and correct normalization of the power outputs even if the dark sensor leakage current would tend to degrade as the sensor ages. One reason why the sensor may degrade is illumination-induced defect creation (known as Staebler-Wronski effect). Defect creation will also alter the photo-response of the sensor. Since the same amount of radiation output (in a duty cycle) is expected on average for all the lasers during printing, this effect should not affect the system's performance. The use of a continuous sensor layer increases interaction between areas illuminated by adjacent VCSEL lasers and averages the previously discussed effect.

To prevent Staebler-Wronski effect from disturbing a correct calibration operation also, the sensor can be pre-degraded before use by exposure to light for an appropriately long time. Typically Staebler-Wronski effect degrades the sensor photo-response to about 70% of its initial value. Thereafter, the effect does not cause any further degradation and the performance of the sensor is to be considered permanently stable. The small reduction in the response to illumination is completely irrelevant given the extremely large on-to-off ratio previously noted. The thickness of a amorphous silicon (a-Si: H) sensor is to be uniform to 2–3% on the area of interest. The effect in the uniformity on the intensity of the transmitted radiation is therefore small. Further, it constitutes a pattern at low spatial frequency, not particularly relevant for the human eye.

For a 14,000 VCSEL array, the total calibration time is approximately 1.54 s, (i.e. 14,000×110 μs) on the basis of a design according to the first embodiment of a single sensor.

To evaluate the effect of this time on throughput, these statistics are considered with a 600-page/minute printer. For such a printer, a page time of 100 ms exists. Therefore, re-calibrating every 1000 pages (i.e. slightly less than once a minute) on such a high-speed printer would reduce the pages per minute output to 591 which is a 1.5% reduction in system output. The calibration per-1000-pages is not considered a requirement to detect laser aging and other problems. Therefore, considerably slower calibrations may be safely adopted and throughput will not be significantly affected even at these very high-speed printers.

Figure 16:
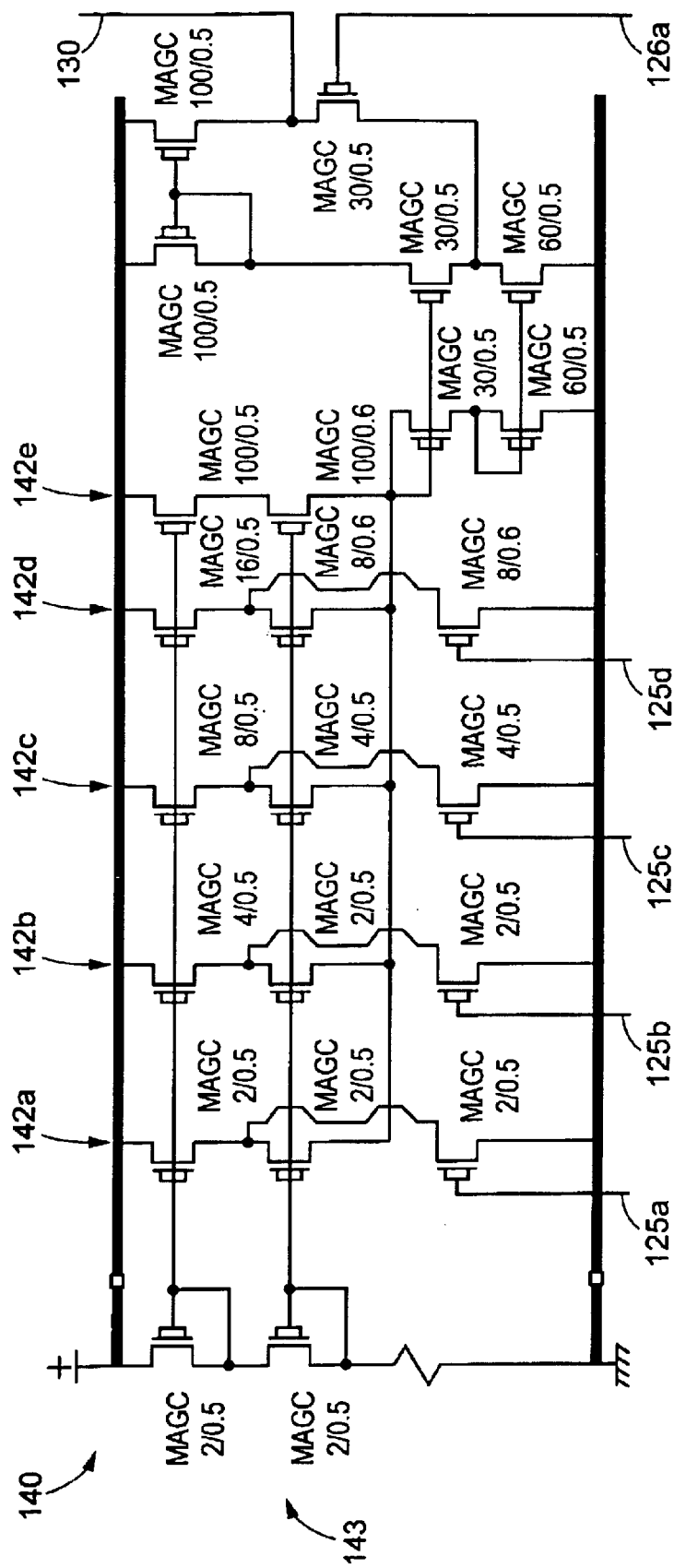
FIG. 16 is a schematic of a driver element of the driver device of FIG. 14.

The actual control of printbar 10 during printing operation is a more critical step due to a higher speed of signals in high-speed printing (e.g. 673 Mhz when two drivers are employed). An embodiment of a driver element 140 of driver 122 for one laser 12, which may be used for this purpose, is shown in FIG. 16. Driver 140 is based on CMOS electronics and has been designed for 4-bit uniformity correction. Such a device consists of a set of appropriate current mirrors, properly gated, and of the actual VCSEL driver stage. Each current mirror is comprised of a set of transistors 142*a–e*, and a set of reference transistors 143 which are shared by all sets 142*a–e*. Each current mirror 142*a–d* is programmable by means of a set of the gating input lines 125*a–d* Gate input lines 125*a–d* are driven by the outputs of low frequency shift registers 118*a–d*. The chosen current correction adds to the reference current delivered by the current mirror 142*e*. The total output current to the light source (laser, LED or other similar one) is delivered by activation signal 130 by the output stage of the driver 122. Output is enabled by enable signal line 126*a*, of enable signal lines 126*a–n* of FIG. 14, when appropriate. High-frequency data are fed into high-speed shift register 128 and enabled out in parallel to print an entire line of an image. With continued attention to FIG. 16, activation signal 130 corresponds to activation signal 130 of FIG. 10.

In a further embodiment of the invention described above, background correction to suppress the small effect of the sensors' leakage current may be provided. This can be relevant when a many-bit correction is desired, such as 8 or 10-bit correction.

Another improvement can be realized by choosing an appropriate firing order for the VCSELs (or any other similar light source) during calibration, as opposed to a linear scan from one end to the opposite one. This assists in reducing the effect of local trapped charge in the intrinsic layer, relatively slow to be released and that might distort the local electric field and alter the photo-current. For example, this may be accomplished by firing alternatively opposite ends of the printbar. An appropriate storage path into the look-up table must be adopted accordingly.

The calibration process described is closed-loop but allows for only one cycle correction. In order to further optimize the system, more feedback cycles for each VCSEL may be added. This can be done either by repeating the process more than once and eventually adjusting the look-up table content further, or extending the duration of the VCSEL test pulse to more than one sensor readout time to obtain the same goal. The latter option (faster) requires changing the set of four shift registers to a slightly more elaborate system of individually addressable latches to repeatedly adjust the content of any cell among the 14 k. Both solutions would slow the calibration process, although still in an acceptable way in order to keep a high throughput in printing.

An alternative to the uniformity correction obtained by drive current adjustment relies on the typical low duty cycle of the VCSEL pulse. A proper modulation of the duty cycle, as dictated by the look-up table values, will in fact provide a time-domain uniformity correction without altering the laser drive current.

In a further embodiment, sensors 34, 34', 53, 67, 74 may be constructed as a plurality of sensors, into a sensor array. In this manner, instead of testing a single laser at a time, multiple lasers of multiple arrays may be tested in parallel. A drawback of using smaller sized arrays as opposed to a single sensor is that the sensor medium may age at different rates for different arrays used. An advantage is that the speed of the calibration process is increased by parallel operation and makes easier to push the calibration procedure toward real-time.

It is to be appreciated that the many aspects of the discussion concerning driving a VCSELs printbar also apply to LED printbars and to single light sources or arrays of light sources that can be contacted by micro-springs and monitored by a proper sensor configuration integrated with the micro-springs.

A micro-spring interconnect structure consists of micro-springs used to electrically connect two or more devices. Such a structure can be used in embodiments where the springs are anchored on any of the devices being contacted. Therefore it is also to be appreciated that the micro-springs, for example in FIG. 3, can be fabricated on the GaAs chip 10 instead of on the glass substrate 32.

The foregoing is considered as illustrative only of the principles of the invention. Further, since numerous modifications and changes will readily occur to those skilled in the art, it is not desired to limit the invention to the exact construction and operation as shown and described, and accordingly, all suitable modifications and equivalents may be resorted to falling within the scope of the invention.

Having thus described the invention, it is now claimed:

1. A hybrid device comprising:

a substrate;

a spring interconnect formed on the substrate, the spring interconnect including,
an elastic material that is operatively associated with a surface of the substrate including,
an anchor portion fixed to the substrate, and
a free portion spaced from the substrate, the free portion including a tip separated from the substrate; and a sensor formed on the substrate, the sensor including an active layer and contacts, said active layer configured to sense light and be at least partially transparent to light at selected wavelengths, said spring interconnect and said sensor being integrated on the substrate.

2. The invention according to claim 1 wherein the hybrid device further includes at least one of a single light source, an array of lasers, and an array of light emitting diodes (LEDs), positioned to emit at least a portion of light through at least a portion of the sensor.

3. The invention according to claim 2 wherein the sensor is designed and aligned with at least one of the laser array and the LED array, to receive the emitted light from at least one of the single light source, some of the lasers of the laser array and some of the LEDs of the LED array.

4. The invention according to claim 2 wherein the sensor, including the active layer, is designed and aligned with at least one of the laser array and the LED array to receive and pass, through the active layer, an amount of the emitted light from a portion of at least one of the laser array and the LED array sufficient for a printing operation.

5. The invention according to claim 4 wherein the substrate is designed and aligned with at least one of the laser array and the LED array to receive and pass, through the active layer, an amount of the emitted light from a portion of at least one of the laser array and the LED array sufficient for a printing operation.

6. The invention according to claim 1 wherein the sensor is an array of sensors.

7. The invention according to claim 1 wherein the sensor and the spring interconnect are comprised of materials which allow for integration of the spring interconnect and the sensor on the single substrate during a manufacturing process, wherein at least one of the materials for the spring interconnect and the sensor is the same.

8. The invention according to claim 1 wherein the elastic material is a stressed metal layer having sub-layers of differing stresses.

9. The invention according to claim 1 wherein a switch is located, between the sensor and the substrate, such that the sensor is an active semi-continuous sensor.

10. The invention according to claim 9 wherein the switch is a thin-film-transistor (TFT).

11. The invention according to claim 1 wherein the spring interconnect is a plurality of spring interconnects.

12. A hybrid device comprising:

a substrate;

a spring interconnect formed on the substrate, the spring interconnect including:
an elastic material that is operatively associated with a surface of the substrate including:
an anchor portion fixed to the substrate, and
a free portion spaced from the substrate; and a sensor formed on the substrate, the sensor including:
a first transparent/conductive layer;
an active layer located on top of the first transparent/conductive layer which active layer is capable of sensing light;
a second transparent/conductive layer located on top of the active layer;
a passivation/release layer located over at least the first transparent/conductive layer and the second transparent/conductive layer;
a first via through the passivation/release layer to the first transparent/conductive layer;
a second via through the passivation/release layer to the second transparent/conductive layer; and
first and second metal layers, deposited in the first and second vias, providing contacts to the first and second transparent/conductive layers respectively, wherein the metal layers act as signal lines to receive and carry signals from the active layer.

13. The invention according to claim 12, wherein the sensor further includes an absorption layer, located between the second transparent/conductive layer and the passivation/release layer, wherein the absorption layer absorbs unwanted visible light prior to being detected by the active layer.

14. The invention according to claim 12, wherein the active layer is a three layer element, wherein a first layer is a n+-doped amorphous silicon, the first layer being one of, but not limited to n+ phosphorous-doped amorphous silicon and n+ arsenic-doped silicon;

wherein a second layer is an intrinsic amorphous silicon;

wherein a third layer is a p+-doped amorphous silicon, the third layer being, but not limited to, p+ boron-doped amorphous silicon.

15. A hybrid device comprising:

a light emitting device capable of emitting light at a certain wavelength and including a plurality of lasers;

a substrate;

a spring interconnect formed on the substrate, the spring interconnect including,
an elastic material operatively associated with a surface of the substrate including,
an elongated anchor portion fixed to the substrate, and
a free portion bent up and away from the substrate; and a sensor formed on the substrate in an integrated manner with the spring interconnect, the sensor including an active layer and contacts, wherein said substrate and said sensor, including the active layer, are at least partially transparent to light at the wavelength emitted by the light emitting device; and said at least one of the sensor and said at least one spring interconnect being separately fabricated and aligned, such that at least a portion of the light emitted directly by the light emitting device is directed through at least a portion of the substrate and the active layer of the sensor.

16. The invention according to claim 15 wherein the sensor is sized such that each of the lasers emits light at least partially through the sensor.

17. The invention according to claim 16 wherein the lasers are arranged as a printbar, and the spring interconnect is in electrical contact with the printbar.

18. The invention according to claim 15 wherein the sensor is a plurality of sensors, sized such that a sub-group of the lasers may emit light through selected ones of the sensors.

19. A calibration/printing system comprising:
- a sensor configuration including a sensor element integrated on a substrate with a plurality of spring interconnects disposed on the substrate;
- a light source aligned with the sensor configuration such that at least a portion of the light directly from the light source is sensed and passed through the active layer of the sensor and at least a first of the spring interconnects is in physical contact with a portion of the light source; and
- a driver chip aligned with the sensor configuration and the light source such that at least a second of the spring interconnects is in physical contact with a portion of the driver chip, and a communication path is formed between the light source and the driver chip by the at least first and second spring interconnects.

20. The invention according to claim 19 wherein the driver chip further includes:
- a comparator for comparing a sensor readout current from the sensor and a reference current;
- a converter arrangement which converts the output of the comparator into digital data representing characteristics of the light source;
- a set of low frequency shift registers configured to receive and store the digital data;
- an activation signal selectively supplied to the light source, the activation signal designed to control operation of the light source to selectively emit light therefrom;
- a driver designed to interpret the digital data as activation signal correction information for the activation signal;
- a high frequency shift-register configured to receive and store digital image data from a source external to the driver chip; and
- an enable/disable output signal from the high frequency shift-register to selectively supply the activation signal and light source correction information to the light source, wherein an amount of light emitted by the light source is controlled.

21. The invention according to claim 20 wherein the digital image data from the source external to the driver chip is supplied as high frequency bit stream data.

22. The invention according to claim 19 wherein the light source is a printbar having an array of light sources, and wherein the printbar is controlled to activate the light sources in a sequential manner to obtain calibration data to be stored in the driver.

23. A hybrid device comprising:
- a spring interconnect structure disposed on a substrate; and
- at least two devices electrically connected by the interconnect structure wherein one of the devices is a sensor disposed on the substrate, the sensor including:
  - a first transparent/conductive layer,
  - an active layer and contacts, said active layer sensing light and being located on top of the first transparent/conductive layer,
  - a second transparent/conductive layer located on top of the active layer,
  - a passivation/release layer located over at least the first transparent/conductive layer and the second transparent/conductive layer, and
  - an absorption layer, located between the second transparent/conductive layer and the passivation/release layer, wherein the absorption layer absorbs unwanted visible light; and another one of the devices is at least one of a single light source, an array of lasers, and an array of light emitting diodes (LEDs), positioned to emit light directly to and at least partially through the active layer of the sensor.

24. A hybrid device comprising:
- a substrate;
- a spring interconnect formed on the substrate which interconnect electrically connects at least a first device and a second device, the spring interconnect including:
  - an elastic material that is operatively associated with a surface of the substrate including:
    - an elongated anchor portion fixed to the substrate, and
    - a bent up free portion which makes an electrical contact with one of the first and second devices; and
- a sensor formed on the substrate, the sensor including an active layer and contacts, said active layer being capable of sensing light, the spring interconnect and the sensor being integrated on the substrate.

* * * * *